United States Patent
Hamasaki et al.

(10) Patent No.: US 7,065,863 B2
(45) Date of Patent: Jun. 27, 2006

(54) LIQUID SPLASH PREVENTING MECHANISM AND COMPONENT MOUNTING APPARATUS

(75) Inventors: Kurayasu Hamasaki, Osaka-fu (JP); Kunio Sakurai, Osaka-fu (JP); Minoru Yamamoto, Hyogo-ken (JP); Hirotsugu Uemori, Hyogo-ken (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 415 days.

(21) Appl. No.: 10/191,056

(22) Filed: Jul. 10, 2002

(65) Prior Publication Data
US 2003/0025278 A1 Feb. 6, 2003

(30) Foreign Application Priority Data
Jul. 12, 2001 (JP) .............................. 2001-212124

(51) Int. Cl.
*B23P 19/00* (2006.01)

(52) U.S. Cl. .......................... 29/740; 29/739; 29/832; 141/356; 210/320; 210/521; 210/801; 210/265

(58) Field of Classification Search ................ 29/739, 29/740, 741, 832; 141/286, 374, 356, 115, 141/86; 210/242.3, 776, 923, 259, 320, 519, 210/521, 533, 540, 801, 804, 744, 104, 265, 210/283, 290
See application file for complete search history.

(56) References Cited

U.S. PATENT DOCUMENTS

| | | | | |
|---|---|---|---|---|
| 3,863,689 A | * | 2/1975 | Lanning et al. ............. | 141/115 |
| 5,066,407 A | * | 11/1991 | Furlow ....................... | 210/744 |

* cited by examiner

*Primary Examiner*—Richard Chang
(74) *Attorney, Agent, or Firm*—Wenderoth, Lind & Ponack, L.L.P.

(57) ABSTRACT

The present invention has for its object to provide a mechanism for preventing a liquid from splashing from a liquid tank, and a component mounting apparatus with this liquid splashing prevention mechanism. The liquid splash prevention mechanism has a first seal member with a circumferential outer face attached to a first driving lever in a lubricating oil tank, and a second seal member with an arc face set in the lubricating oil tank correspondingly to the first seal member so that a sealing gap for preventing lubricating oil from scattering is formed between the first seal member and the second seal member. Moreover, the lubricating oil is filled in the sealing gap. Scattering of the lubricating oil is more surely prevented by this arrangement. Quality degradation to be caused by adhesion of the lubricating oil to printed boards and the like can be prevented, and productivity can be improved.

7 Claims, 5 Drawing Sheets

LIQUID SPLASH PREVENTING MECHANISM AND COMPONENT MOUNTING APPARATUS

BACKGROUND OF THE INVENTION

The present invention relates to a mechanism for preventing a liquid in a liquid storage tank from being splashed to an outside by a driving mechanism, and a component mounting apparatus with the liquid splash preventing mechanism.

For the component mounting apparatus, such a one as constituted, e.g., as shown in FIG. 6 has been known conventionally. The Component mounting apparatus 50 shown in FIG. 6 is a so-called rotary type, which mounts electronic components 51 to specified positions on a printed board 53 by transferring suction nozzles 55, for sucking and holding electronic components 51 to be mounted to the printed board 53, circumferentially between a component supply position 41 and a component setting position 42. The component mounting apparatus 50 is provided with a component supply device 52 for supplying electronic components 51 at the component supply position 41, a substrate support device 54 for supporting the printed board 53 as a mounting object to which electronic components 51 are to be mounted and for positioning the printed board 53 to the component setting position 42, an index unit 59 having a mounting head 56 to which the suction nozzles 55 are installed to be movable up and down whereby each suction nozzle 55 is disposed at the component supply position 41 and at the component setting position 42 by intermittently rotating the mounting head 56, and a lift mechanism 45 for moving the suction nozzles 55 up and down.

The component supply device 52 is constructed in an arrangement in which a plurality of component supply cassettes 57 for storing and supplying electronic components 51 are arranged correspondingly to types and a number of the electronic components 51 required for mounting to the printed board 53. The device 52 moves the component supply cassette 57 holding a desired electronic component 51 so that the electronic component 51 required for mounting is disposed at the component supply position 41, thereby supplying the desired electronic component 51.

The substrate support device 54 has an XY-table 58 for positioning and supporting the printed board 53. For mounting a predetermined electronic component 51 to a component mounting position on the printed board 53, the XY-table 58 moves in two, i.e., X and Y directions orthogonal to each other in a plane to bring the component mounting position to be opposite to a suction nozzle 55 disposed at the component setting position 42.

The mounting head 56 is adapted to move the suction nozzle 55 down while controlling the suction nozzle 55 to a necessary height in accordance with an arrangement position of the suction nozzle 55 so as to suck the electronic component 51 at the component supply position 41 or to mount the electronic component 51 at the component setting position 42.

The index unit 59 is a device for intermittently rotating the mounting head 56, and has the mounting head 56 fitted to a first output shaft 59a projecting downward from the index unit 59. Therefore, when the mounting head 56 is intermittently rotated by rotation of the first output shaft 59a, the suction nozzle 55 fixed to the mounting head 56 sucks and mounts an electronic component 51 at each of stop positions. A rotary member 60 is fitted to a second output shaft 59b of the index unit 59.

The lift mechanism 45 is a device which is arranged adjacent to the index unit 59, and moves the suction nozzle 55 up and down in accordance with the intermittently rotating operation of the index unit 59. The lift mechanism 45 is constituted in a structure as described below.

An oil tank part 77 with a lubrication oil 78 filled inside is installed to a driving part 66 of the lift mechanism 45. A cam shaft 62 is fitted rotatably to the oil tank part 77, to which a rotary member 63 is fitted at an outside of the oil tank part 77, and a plate cam 65 is fixed inside the oil tank part 77. The plate cam 65 and a roller 69 to be depicted later soak in the oil 78. A belt 61 is hung between the rotary member 60 of the index unit 59 and the rotary member 63, whereby the cam shaft 62 rotates following rotation of the rotary member 60 of the index unit 59.

Inside the oil tank part 77, there is arranged a first driving lever 68 which can rotate about a mounting shaft 67 set to the oil tank part 77 and has an approximately Y-shaped form caused by first, second and third arms. The roller 69 which is to track an outer surface of the plate cam 65 is mounted rotatably to a leading end of first arm 68a of the first driving lever 68. At the same time, one end of a spring 70 attached to the oil tank part 77 is in contact with second arm 68b of the first driving lever 68. The roller 69 is accordingly pressed to the outer surface of the plate cam 65 and is enabled to surely track the outer surface of the plate cam 65 through a rotational action of the first driving lever 68 about the mounting shaft 67 by an urging force of the spring 70. In consequence, the first driving lever 68 traces a shape of the outer surface of the plate cam 65 rotating in accordance with rotation of the rotary member 60 of the index unit 59.

One end of a first coupling link 71 is connected to a leading end of third arm 68c of the first driving lever 68. Another end of the first coupling link 71 is connected together with one end of a second coupling link 73 to a link block 72 by a coupling pin 74. Another end of the second coupling link 73 is connected to one end of a second driving lever 75 supported rotatably to a frame member of the component mounting apparatus 50. A roller 76 for lifting is attached rotatably to another end of the second driving lever 75. The roller 76 for lifting is engaged with a part of the mounting head 56 and constituted so as to follow oscillation of the second driving lever 75.

As described earlier, the plate cam 65 and the roller 69 soak in the oil 78 in the oil tank part 77. A leading end part of the third arm 68c of the first driving lever 68 installed to the inside of the oil tank part 77 projects outside of the oil tank part 77 through an opening part 77a formed in the oil tank part 77. The opening part 77a is provided with an oil guard 80 for preventing the oil 78 in the oil tank part 77 from scattering to the outside through the opening part 77a.

The conventional component mounting apparatus 50 constituted as above operates in the following manner.

The first output shaft 59a starts to be intermittently rotated by the index unit 59, thereby starting to intermittently rotate the mounting head 56 as well. The suction nozzle 55 attached to the mounting head 56 sucks and holds the electronic component 51 automatically supplied from the component supply device 52, and is displaced by the mounting head 56 from the component supply position 41 to the component setting position 42 through the above intermittent rotation.

Simultaneously with the above displacing operation, the rotary member 63 attached to the oil tank part 77 is also rotated via the belt 61 by rotation of the second output shaft 59b of the index unit 59 and the rotary member 60. When the cam shaft 62 consequently rotates in the oil 78 of the oil tank part 77, the cam plate 65 rotates similarly. Accordingly, the roller 69 pressed to the outer surface of the plate cam 65 tracks the outer surface of the plate cam 65, whereby the first driving lever 68 oscillates about the mounting shaft 67.

This oscillation of the first driving lever 68 oscillates the link block 72 about the coupling pin 74. The first and second coupling links 71 and 73 move up and down while being restricted by oscillation of the link block 72. The second driving lever 75 oscillates in accordance with the up and down movement of the first and second coupling links, and the roller 76 for lifting of the second driving lever 75 moves up and down accordingly. A part of the mounting head 56 engaged with the roller 76 for lifting follows the up and down movement, hence moving the suction nozzle 55 up and down. In the manner as above, the suction nozzle 55 is moved down at, e.g., the component setting position 42 and the electronic component 51 is mounted to the component mounting position on the printed board 53.

In the above-described conventional arrangement, the oil 78 whirled up by operation of the plate cam 56 and the roller 69 inside the oil tank part 77 adheres to the first driving lever 68 in its entirety and the guard 80, and probably splashes to the outside through the opening part 77a of the oil tank part 77 as a result of oscillation of the first driving lever 68. The oil 78 may be turned into spray when stirred by the plate cam 65 and the roller 69, thereby scattering to the outside of the oil tank part 77. Also, the oil 78 may stream down the first and second coupling links 71 and 73, and the like, to unfavorably drop onto the suction nozzle 55 and the printed board 53.

SUMMARY OF THE INVENTION

The present invention has for its object to provide a mechanism for preventing a liquid, such as an oil in an oil tank part or the like, from scattering to outside from a liquid tank, and a component mounting apparatus with this liquid splashing prevention mechanism, while eliminating the above-discussed problems inherent in the conventional art.

In order to accomplish the above object, according to a first aspect of the present invention, there is provided a component mounting apparatus which comprises a lift mechanism including a liquid splash preventing mechanism for moving a component holding member up and down when a component is to be held and mounted by the component holding member, wherein the liquid splash preventing mechanism, arranged at an opening part formed in an upper wall of a liquid storage tank, has a first seal member and a second seal member attached correspondingly to the opening part so as to prevent a liquid filled in the liquid storage tank from scattering to outside of the liquid storage tank through the opening part, with the first seal member being arranged opposite to the second seal member via a sealing gap formed between a first outer face of the first seal member and a second outer face of the second seal member for preventing scattering of the liquid by virtue of being filled with the liquid, and with the second outer face of the second seal member being shaped in conformity with the first outer face of the first seal member.

In the first aspect, the component mounting apparatus may be designed so that the first seal member is a cylindrical member and the first outer face is an outer circumferential face of the cylindrical member, and the second outer face of the second seal member is a U-shaped arc face conforming to the outer circumferential face of the cylindrical member.

In the first aspect, the component mounting apparatus may be designed so that the apparatus further comprises a holding member rotating/moving device for moving to rotate the component holding member along a circumference.

According to a second aspect of the present invention, there is provided a component mounting apparatus which comprises a holding member rotating/moving device for moving to rotate a component holding member along a circumference, and a lift mechanism for moving the component holding member up and down when a component is to be held and mounted by the component holding member, wherein the lift mechanism has a driving part for generating a driving force for up and down motion of the component holding member, and a liquid splash preventing mechanism, with the driving part including a cam which is stored in a state while soaked in a lubricating oil inside a lubricating oil tank having an opening part formed in an upper wall and a roller in contact with the cam, and a first driving lever having the roller attached to one end thereof and having another end extending to an outside of the lubricating oil tank through the opening part; and with the liquid splash preventing mechanism being arranged at the opening part, and having a first seal member for preventing the lubricating oil from scattering to the outside of the lubricating oil tank through the opening part, and a second seal member fitted to the upper wall, the first seal member being a cylindrical member which supports the first driving lever and arranged opposite to the second seal member via a sealing gap formed between an outer circumferential face of the first seal member and the second seal member for preventing scattering of the lubricants oil by virtue of being filled with the lubricating oil, and with the second seal member being shaped to have an U-shaped arc face conforming to the outer circumferential face of the first seal member.

In the second aspect, the component mounting apparatus may be designed so that the rotating/moving device further comprises a mounting head part attaching the component holding member thereto, wherein the cam is driven by the rotating/moving device, and the driving part generates the driving force for the up and down motion of the component holding member by a driving of the first driving lever caused by the driving of the cam, with the lift mechanism further having a link mechanism part for moving the component holding member up and down by the driving force generated at the driving part, and with the link mechanism part having a coupling link part coupled to the first driving lever, and a second driving lever having one end coupled to the coupling link part and having another end engaged with the mounting head part.

According to a third aspect of the present invention, there is provided a liquid splash preventing mechanism installed at an opening part formed in an upper wall of a liquid storage tank, which comprises a first seal member and a second seal member arranged correspondingly to the opening part, and for preventing a liquid stored in the liquid storage tank from scattering to an outside of the liquid storage tank through the opening part, with the first seal member being arranged opposite to the second seal member via a sealing gap formed between a first outer face of the first seal member and a second outer face of the second seal member for preventing scattering of the liquid by virtue of being filled with the liquid, and with the second outer face of the second seal member being shaped in conformity with the first outer face of the first seal member.

In the third aspect, the liquid splash preventing mechanism may be designed so that the first seal member is a cylindrical member and the first outer face is an outer circumferential face of the cylindrical member, and the second outer face of the second seal member is a U-shaped arc face conforming to the outer circumferential face of the cylindrical member.

According to the above component mounting apparatus in the first and the second aspects, and the liquid splash preventing mechanism in the third aspect, there are provided the first seal member and the second seal member, which are arranged via the sealing gap where liquid as an object to be prevented from scattering is filled between the first seal member and the second seal member, so that the liquid which tends to scatter from the opening part of the liquid storage tank can be kept inside the liquid storage tank by the liquid filled in the sealing gap. The liquid can be prevented from scattering to the outside at the lift mechanism, and component-mounted members or the like which are manufactured by the component mounting apparatus can be prevented from being stained with scattering liquid and prevented from quality failures. Consequently, productivity can be improved. Since the first seal member is a cylindrical member and the second seal member is constituted to have an arc face conforming to the outer circumferential face of the cylindrical member, the liquid can be prevented from scattering to the outside while a space, when the first seal member rotates in its circumference direction, can be saved.

BRIEF DESCRIPTION OF THE DRAWINGS

These and other objects and features of the present invention will become clear from the following description taken in conjunction with the preferred embodiments thereof with reference to the accompanying drawings in which.

DETAILED DESCRIPTION OF THE PREFERRED EMBODIMENTS

Figure 1:
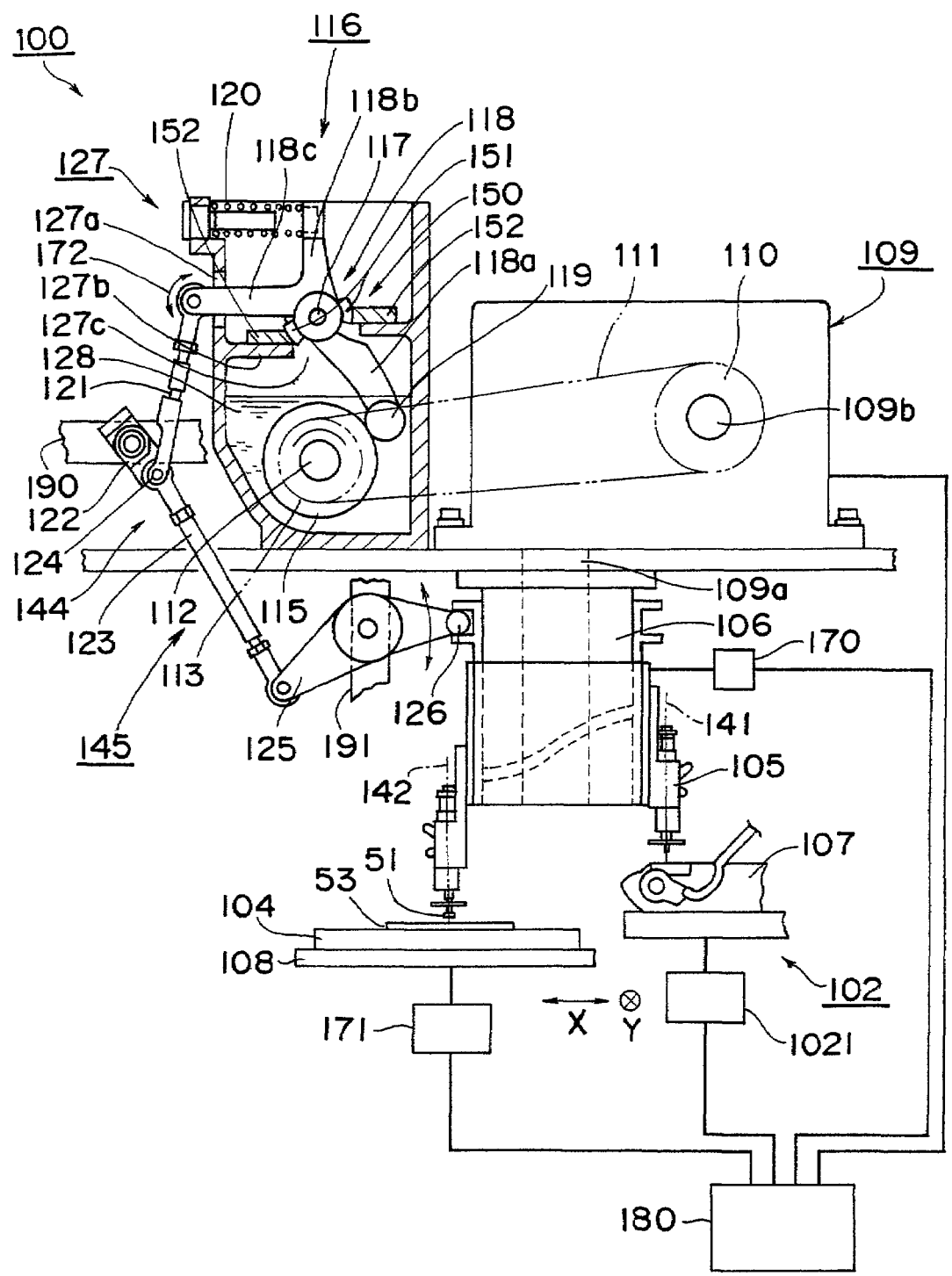
FIG. 1 is a diagram showing a configuration of a component mounting apparatus in a first embodiment of the present invention.

A liquid splash preventing mechanism and a component mounting apparatus according to preferred embodiments of the present invention will be described below with reference to the attached drawings. The component mounting apparatus is provided with a lift mechanism which moves up and down a component holding member for holding various components such as electronic components, and the like, and mounting the components to various mounting objects such as printed boards, and the like, and to which the liquid splash preventing mechanism is installed. The liquid splash preventing mechanism will be described below in relation to the above component mounting apparatus by way of example. Like parts are designated by like reference numerals throughout the drawings.

An electronic component mounting apparatus according to an embodiment is an apparatus for manufacturing electronic circuit boards by mounting electronic components 51 to predetermined component mounting positions on a printed board 53 as indicated in FIG. 1. The present invention is not limited to this embodiment, and is applicable to component mounting apparatuses in general of a type constructed including a driving mechanism, wherein the driving mechanism is set inside a liquid storage tank for storing a liquid such as a lubricating oil or the like while part of the driving mechanism extends to outside of the liquid storage tank through an opening part formed in the liquid storage tank, thereby necessitating prevention of the liquid from scattering to the outside through the opening part.

Component mounting apparatus 100 of the embodiment shown in FIG. 1 is a rotary type for mounting the electronic component 51 to a specified position on the printed board 53 by circumferentially moving a suction nozzle 105 between a component supply position 141 and a component setting position 142, wherein the suction nozzle 105 is an example functioning as the component holding member for holding components, and sucks and holds the electronic component 51 to be mounted to the printed board 53. The component mounting apparatus 100 of this type has: a component supply device 102 for supplying electronic components 51 at the component supply position 141; a substrate support device 104 for supporting the printed board 53, as a mounting object to which the electronic components 51 are to be mounted, and for positioning the printed board 53 relative to the component setting position 142; a holding member rotating/moving device 109 having a mounting head 106 with suction nozzles 105 constructed to be movable up and down, which device 109 intermittently rotates the mounting head 106 so as to circumferentially shift the suction nozzles 105, thereby disposing the suction nozzles 105 to the component supply position 141 and the component setting position 142; a lift mechanism 145 for moving the suction nozzles 105 up and down when the electronic components 51 are to be held and mounted; and a controller 180 for controlling operation of these constitutional parts to perform a component mounting operation.

The component supply device 102 is constituted in an arrangement in which a plurality of component supply cassettes 107 for storing and supplying electronic components 51 are arranged correspondingly to types and a number of electronic components 51 required for mounting to the printed board 53. The component supply device 102 moves each component supply cassette 107 holding a desired electronic component 51 by a cassette moving device 1021 in a Y-direction orthogonal to a sheet face of FIG. 1 so that an electronic component 51 necessary for mounting is disposed at the component supply position 141. Each desired electronic component 51 is supplied in this manner. The cassette moving device 1021 has, e.g., a ball screw structure and is controlled to operate by the controller 180.

The substrate support device 104 has an XY-table 108 for positioning and supporting the printed board 53. The XY-table 108 moves in two directions, i.e., an X-direction parallel to the sheet face of FIG. 1 and the Y-direction so that a component mounting position is made opposite to the suction nozzle 105 disposed at the component setting position 142 in order to mount a predetermined electronic component 51 to the component mounting position on the printed board 53. Movement of the XY-table 108 as above is obtained, for instance, by a driving device 171 having a ball screw structure. The driving device 171 is controlled to operate by the controller 180.

The mounting head 106 is constructed so that the suction nozzle 105 is controlled to a necessary height in accordance with an arrangement position thereof, and the suction nozzle 105 is moved down by lift mechanism 145 to suck the electronic component 51 at the component supply position 141 or to mount the electronic component 51 at the component setting position 142. Since the suction nozzle 105 is employed as an example functioning as the component holding member according to the embodiment, a suction device 170 for performing a suction operation of sucking and adhering the electronic components by the suction nozzle is connected to the mounting head 106. The suction device 170 is controlled by the controller 180.

The holding member rotating/moving device 109 is controlled by the controller 180 to operate to intermittently rotate the mounting head 106, having the mounting head 106 installed to a first output shaft 109a projecting downward from the device 109. A suction nozzle 105 attached to the mounting head 106 sucks and mounts an electronic component 51 at each stop position through intermittent rotation of the mounting head 106 by the first output shaft 109a. A pulley-like rotary member 110 is fitted to a second output shaft 109b of the holding member rotating/moving device 109.

The lift mechanism 145 is arranged adjacent to the holding member rotating moving/device 109, and is a device for moving up and down suction nozzle 105 in accordance with intermittent rotational movement of the device 109, which is constructed as follows.

Roughly speaking, the lift mechanism 145 has a driving part 116 for generating a driving force for the up and down movement of the suction nozzle 105, and a link mechanism 144 for moving up and down the suction nozzle 105 by a driving force generated at the driving part 116.

In the driving part 116, there is provided a lubricating oil tank 127 in which a lubricating oil 128 is filled, corresponding to an example exerting a function of the liquid storage tank. A cam shaft 112 is fitted rotatably to the lubricating oil tank 127 with the shaft 112 penetrating the lubricating oil tank 127. A pulley-like rotary member 113 is fitted to the cam shaft 112 outside of the lubricating oil tank 127, and a plate cam 115 is fitted to the shaft 112 in the lubricating oil tank 127. The plate cam 115 and a roller 119 to be described later soak in the lubricating oil 128 and, a supporting part for the cam shaft 112 in the lubricating oil tank 127 is constructed so as to support the cam shaft 112 rotatably without leaking the lubricating oil 128. A belt 111 is looped between the rotary member 110 of the holding member rotating/moving device 109 and the rotary member 113, so that the cam shaft 112 rotates in accordance with rotation of the rotary member 110 of the rotating/moving device 109.

Inside the lubricating oil tank 127, a roughly Y-shaped first driving lever 118, formed by a first arm 118a, second arm 118b and a third arm 118c, is arranged by a mounting shaft 117 penetrating the first driving lever 118 at a nearly central part of the lever 118, with the central part corresponding to a joint part of the first-third arms. The mounting shaft 117 and the first driving lever 118 are fixed to each other, and the mounting shaft 117 is fitted rotatably to the lubricating oil tank 127 in a state in which the lubricating oil 128 is prevented from leaking to the outside. Therefore, the first driving lever 118 rotates together with the mounting shaft 117 in a circumferential direction of the mounting shaft 117 about the mounting shaft 117. As indicated in FIG. 1, in a state of the first driving lever 118 being attached to the lubricating oil tank 127 by the mounting shaft 117, the first arm 118a extends downward with respect to the mounting shaft 117, while the second arm 118b extends upward and the third arm 118c extends leftward.

The roller 119 which tracks an outer surface of the plate cam 115 is mounted rotatably to a leading end of the first arm 118a. One end of a spring 120 attached to the lubricating oil tank 127 contacts a leading end part of the second arm 118b of the first driving lever 118. The roller 119 can be accordingly pressed to surely track an outer surface of the plate cam 115 by rotational action of the first driving lever 118 about the mounting shaft 117 by an urging force of the spring 120. The first driving lever 118 oscillates about the mounting shaft 117 in accordance with the plate cam 115 rotating along with the rotary member 110 of the holding member rotating/moving device 109.

As shown in FIG. 1, an upper wall 127b is formed as a partition of a lubricating oil storage chamber in the lubricating oil tank 127. The upper wall 127b has an opening part 127c through which the first driving lever 118 is inserted. The mounting shaft 117 is positioned slightly higher than the upper wall 127b and disposed correspondingly relative to the opening part 127c of the upper wall 127b.

A liquid splash preventing mechanism 150 is arranged correspondingly relative to the opening part 127c. The liquid splash preventing mechanism 150 has a first seal member 151 and a second seal member 152 attached to the upper wall 127b, thereby preventing the lubricating oil 128 from scattering to the outside of the lubricating oil tank 127 through the opening part 127c. The liquid splash preventing mechanism 150 will be depicted with reference to FIGS. 1–3.

Since the first driving lever 118 oscillates together with the mounting shaft 117 about the mounting shaft 117 in the embodiment as described hereinabove, the first seal member 151 is an arc-shaped member concentrically arranged with respect to the mounting shaft 117 on a circumferential face of the mounting shaft 117 for the first driving lever 118 as is clearly shown in FIG. 2, and has a circumferential outer face 151a as an example functioning as a first outer face. The first seal member 151 is divided into two portions along a circumferential direction of the mounting shaft 117 as indicated by an enlarged scale in FIG. 2. Each portion of the first seal member 151 extends along an axial direction of the mounting shaft 117.

The first seal member 151 is not restricted to this structure and can be constituted of the mounting shaft 117 itself having the circumferential outer face.

Figure 2:
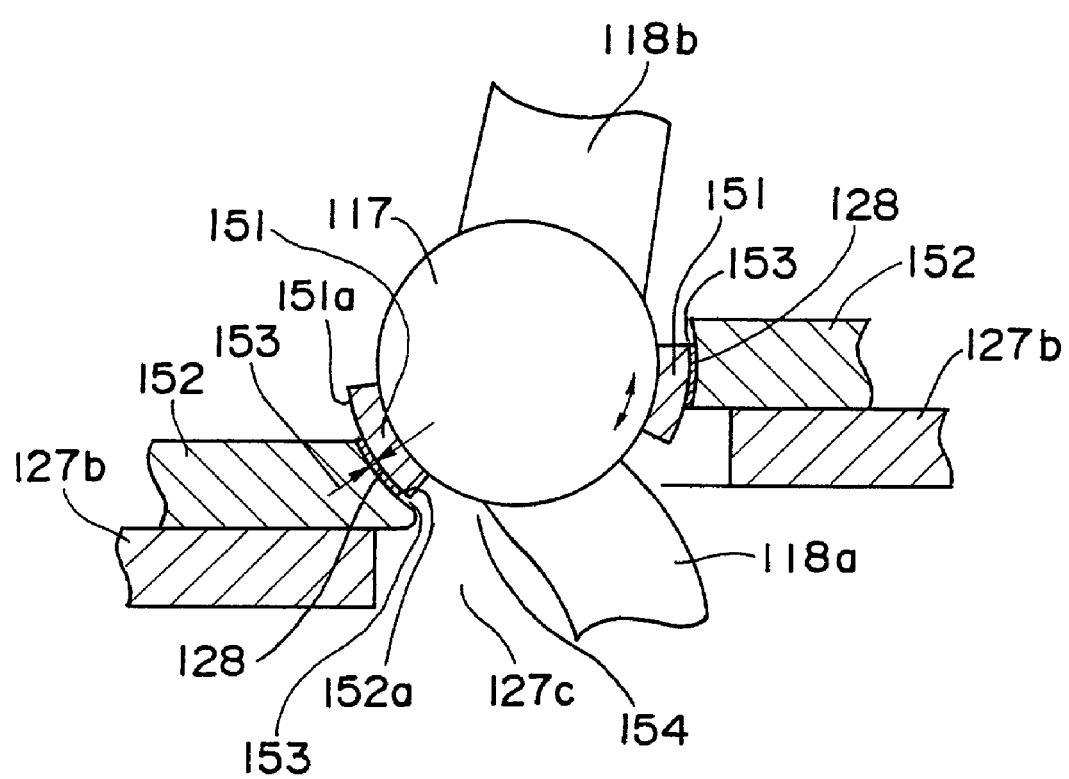
FIG. 2 is an enlarged view of a liquid splash preventing mechanism part installed in the component mounting apparatus shown in FIG. 1.

As indicated in FIG. 2, there are provided two second seal members 152 at positions corresponding to the opening part 127c of the upper wall 127b to be opposite to each portion of the first seal member 151 fitted to the mounting shaft 117. Each of the second seal members 152 is attached to the upper wall 127b along the axial direction of the mounting shaft 117. Each second seal member 152 has a concave arc face 152a shaped to be concentric or nearly concentric in conformity with the outer circumferential face 151a of the first seal member 151. The arc face 152a corresponds to one example functioning as a second outer face.

Figure 3:
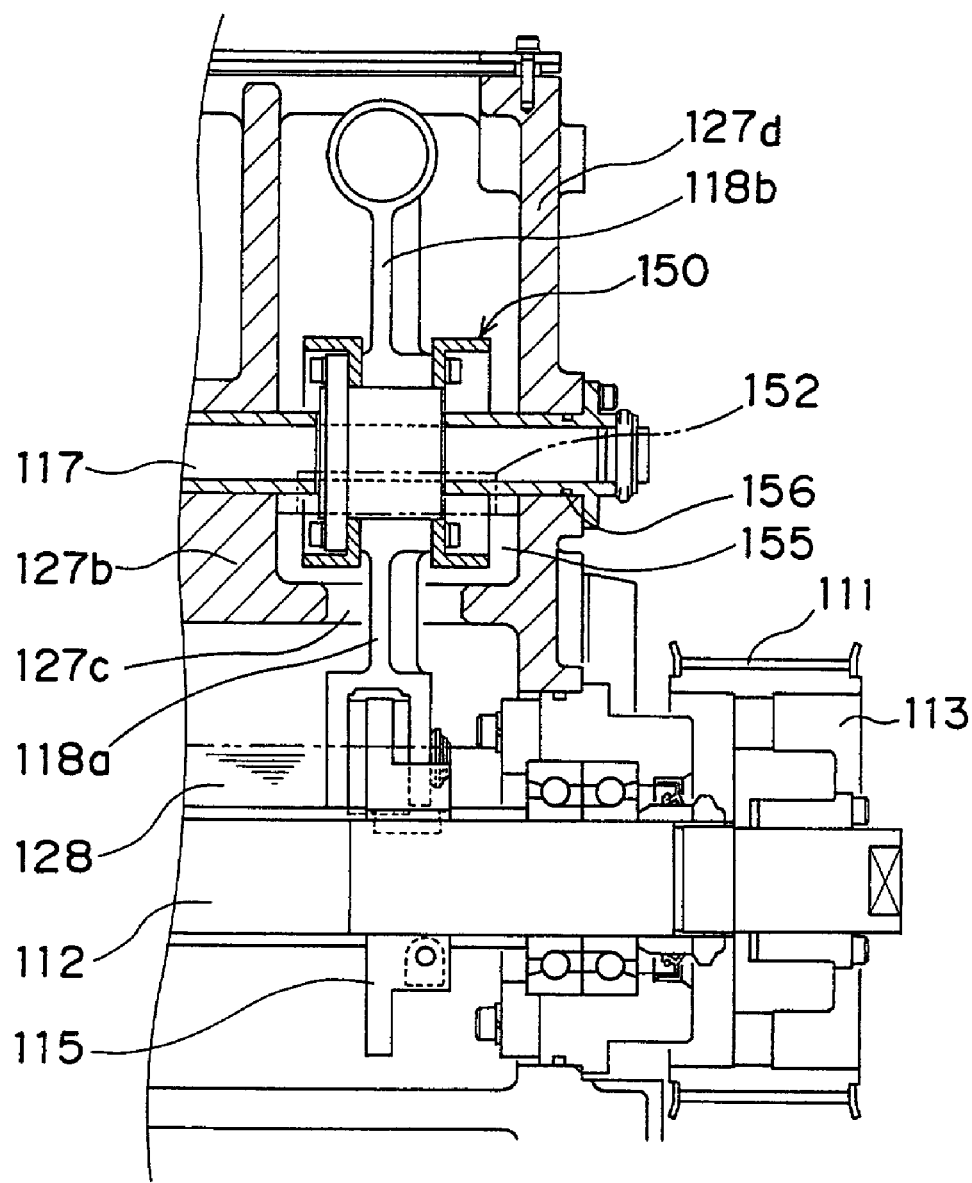
FIG. 3 is a sectional view along an axial direction of a mounting shaft at the liquid splash preventing mechanism part installed in the component mounting apparatus of FIG. 1.

The structure of the component mounting apparatus 100 is schematically shown in FIG. 1. The upper wall 127b part is illustrated slightly different in FIG. 1 than from FIG. 3 because FIG. 3 is a relatively detailed view as compared with FIG. 1.

The portions of the first seal member 151 are arranged relative to the second seal members 152 so that the outer circumferential faces 151a of the portions of the first seal member 151 are positioned adjacent to the arc faces 152a of the second seal members 152 and at the same time, concentric with the arc faces 152a. In this case, as indicated in FIG. 2, the portions of the first seal member 151 are disposed relative to the second seal members 152 to be opposite to the second seal members 152 so as to form sealing gaps 153 between the arc faces 152a and the outer circumferential faces 151a for preventing the lubricating oil 128 stored in the lubricating oil tank 127 from scattering to the outside of the lubricating oil tank 127 through the opening part 127c. This scattering can be prevented more effectively by filling the lubricating oil 128 into the sealing gaps 153.

As above, the portions of the first seal member 151 are spaced in the circumferential direction of the mounting shaft 117 while the second seal members 152 are arranged correspondingly relative to the first seal members 151. Therefore, the sealing gaps 153 are formed in the circumferential direction of the mounting shaft 117, and moreover, when the lubricating oil is filled in the sealing gaps 153, prevention of scattering of the lubricating oil can hence be exerted more effectively. In the meantime, the arrangement of the portions of the first seal member 151 spaced in the circumferential direction of the mounting shaft 117 forms a passage 154 between the portions of the first seal member 151. The passage 154 extends along the axial direction of the mounting shaft 117, and consequently, between the opening part 127c of the upper wall 127b and the passage 154 is not rendered air-tight. However, the passage 154 is formed in a chamber 155 defined by the mounting shaft 117, and a side wall 127d and the upper wall 127b of the lubricating oil tank 127 as shown in FIG. 3. Accordingly, a splash of the lubricating oil 128 even if reaching the opening part 127c and the passage 154 is prevented from moving directly and linearly towards the second arm 118b and the third arm 118c and, is retained in the chamber 155. Although the chamber 155 communicates with an exterior of the lubricating oil tank 127 primarily via the sealing gaps 153, the sealing gaps 153 are filled with the lubricating oil 128 as mentioned above, thereby enabling prevention of the splash from passing between the chamber 155 and the outside of the lubricating oil tank 127. Between the mounting shaft 117 and the side wall 127d of the lubricating oil tank 127 is sealed by an O-ring 156.

Because of the above constitution, the opening part 127c is covered with the sealing gaps 153, so that the lubricating oil 128 can be prevented by the sealing gaps 153 from splashing. An effect is larger as sealing gap 153 is made narrower. Moreover, according to the present embodiment, the lubricating oil 128 is filled preferably between an entire face of the arc faces 152a and the circumferential faces 151a. The lubricating oil 128 filled in the sealing gaps 153 forms a liquid seal layer, whereby the lubricating oil 128 stored in the lubricating oil tank 127 can be more effectively prevented from splashing to the outside of the lubricating oil tank 127 through the opening part 127c. Furthermore, since scattering prevention for the lubricating oil 128 is realized by the liquid seal layer formed of the lubricating oil 128 as above, even the lubricating oil 128 of a splash can be prevented from being discharged to the outside. Quality failures resulting from adhesion of the lubricating oil 128, scattering to the outside, to the suction nozzles 105, printed boards 53, and the like can be thus prevented. Consequently, productivity can be improved.

In a case of adopting the structure in which the second seal members 152 are arranged at the upper wall 127b of the lubricating oil tank 127 as in the present embodiment, dimensions of the above sealing gaps 153 can be set very finely by, e.g., adjusting thicknesses of the second seal members 152 in a like manner. Accordingly, the above structure works to surely achieve scattering prevention of the lubricating oil 128, and thus avoiding quality failures and improving productivity can be achieved.

Since it is preferred to fill a liquid in the sealing gaps 153 so as to form the liquid seal layer as described above, specific dimensions of the sealing gaps 153 differ depending on liquid as an object to be prevented from scattering, and its viscosity. For the lubricating oil 128 of the embodiment, the sealing gaps 153 are set to be not larger than 0.3 mm, which enables forming the above liquid seal layer and preventing ventilation between the opening part 127c and the outside of the lubricating oil tank 127.

The portions of the first seal member 151 are rotated by oscillation of the first driving lever 118, and therefore manufactured larger in a direction of rotation in comparison with the second seal members 152 as shown in FIG. 2. In other words, the portions of the first seal member 151 and the second seal members 152 are manufactured so that the arc faces 152a can always form the sealing gaps 153 along with the outer circumferential faces 151a.

In the liquid splash preventing mechanism 150 of the embodiment, since the mounting shaft 117 oscillates in its circumferential direction, the portions of the first seal member 151 are shaped to have the circumferential outer faces, and the second seal members 152 are equipped with the arc faces 152a in conformity with the circumferential outer faces of the portions of the first seal member. The liquid splash preventing mechanism is not limited to this constitution of the embodiment. That is, it is enough to provide a first seal member and a second seal member respectively having a first outer face and a second outer face conforming to the first outer face, which form sealing gap 153 therebetween.

A leading end of the third arm 118c of the first driving lever 118 is projected through an arm projection hole 127a formed in the side wall of the lubricating oil tank 127 at a position higher than the upper wall 127b where the lubricating oil 128 is prevented from scattering by operation of the liquid splash preventing mechanism 150. To this projecting leading end of the third arm 118c is coupled one end of a first coupling link 121, while another end of the first coupling link 121 is coupled together with one end of a second coupling link 123 to one end part of a link block 122 by a coupling pin 124. The link block 122 is mounted rotatably at another end part to a frame member 190 of the component mounting apparatus 100. Another end of the second coupling link 123 is coupled to one end of a second driving lever 125 supported rotatably to a frame member 191 of the component mounting apparatus 100. A roller for lifting 126 is attached rotatably to another end of the second driving lever 125. This is engaged with a part of the mounting head 106 to keep up with oscillation of the second driving lever 125.

Operation of the component mounting apparatus 100 constituted as above will be described below. Since the operation is fundamentally similar to the operation in the already discussed conventional component mounting apparatus 50, it will be described briefly. The operation is controlled by the controller 180.

The mounting head 106 is intermittently rotated by driving the holding member rotating/moving device 109. A suction nozzle 105 fitted to the mounting head 106 sucks and holds an electronic component 51 received from the component supply device 102 at the component supply position 141, and shifts the electronic component 51 to the component setting position 142.

Simultaneously with this shifting of the electronic component 51, the rotary member 113 attached to the lubricating oil tank 127 is rotated via the belt 111. The plate cam 115 is rotated in accordance with rotation of the rotary member 113 in the lubricating oil 128 inside the lubricating oil tank 127. As the roller 119 tracks the plate cam 115, the first driving lever 118 oscillates about the mounting shaft 117 along an arrow direction 172.

In some cases, the lubricating oil 128 in the lubricating oil tank 127 may jump to reach the opening part 127c of the upper wall 127b or further into the chamber 155 because of rotation of the plate cam 115, the tracking of the roller 119 to the plate cam 115, and the like. However, the liquid splash preventing mechanism 150 provided in the embodiment prevents this jumping lubricating oil 128 or spray of the lubricating oil 128 from being discharged to the outside even in such a case as above.

Accordingly, quality failures to be caused by adhesion of scattering lubricating oil 128 to the suction nozzle 105, the printed board 53 and the like can be prevented, and productivity can be improved eventually.

The link block 122 oscillates via the first coupling link 121 in consequence to oscillation of the first driving lever 118, which further oscillates the second driving lever 125 via the second coupling link 123. As a result, the roller 126 of the second driving lever 125 moves up and down, and a part of the mounting head 106 engaged with the roller 126 follows this up and down movement. The suction nozzle 105 is moved up and down accordingly. When the suction nozzle 105 is moved down in the above manner, e.g., at the component setting position 142, the electronic component 51 is mounted at the component mounting position on the printed board 53.

The foregoing description is based on a case in which the liquid splash preventing mechanism 150 is set to the component mounting apparatus 100. The present invention is not limited to this, and the liquid splash preventing mechanism 150 can be provided for a structure which requires preventing a stored liquid from scattering through an opening part formed in an upper part of a liquid storage tank.

If it is not necessary to take prevention of liquid of a spray from scattering to the outside into account, the liquid may not be filled in the sealing gaps 153.

Figure 4:
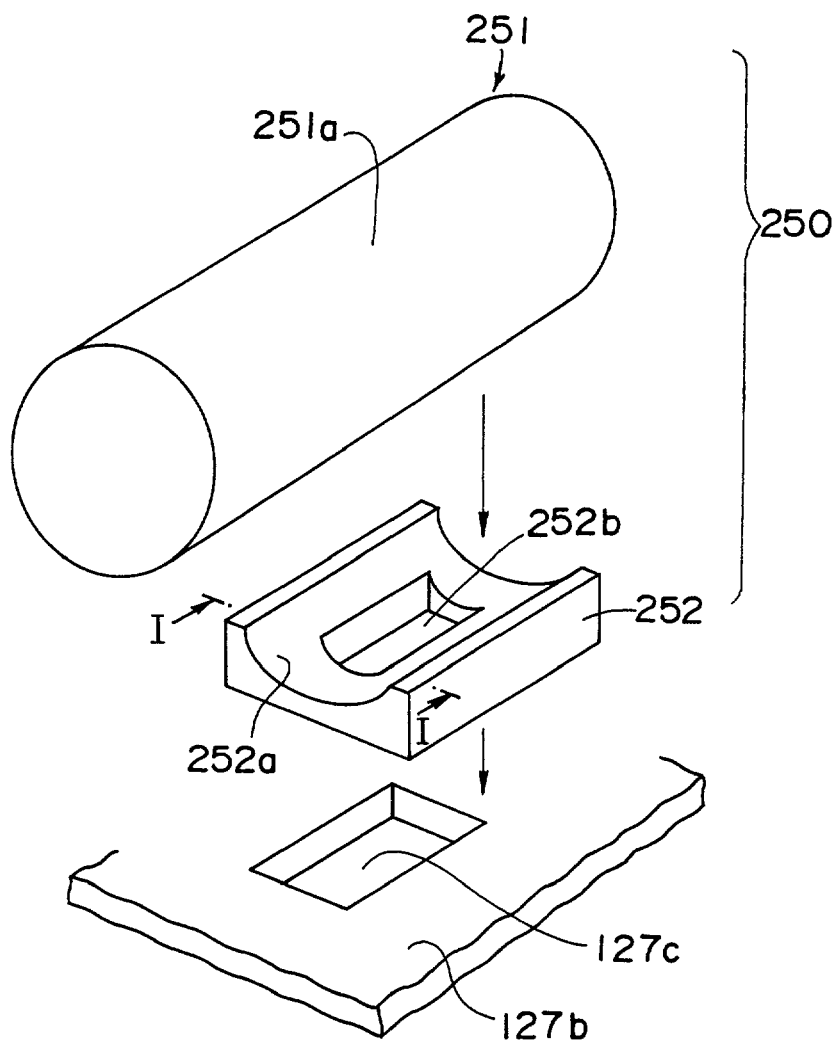
FIG. 4 is a perspective view showing a basic structure of a modified example of the liquid splash preventing mechanism.
Figure 5:
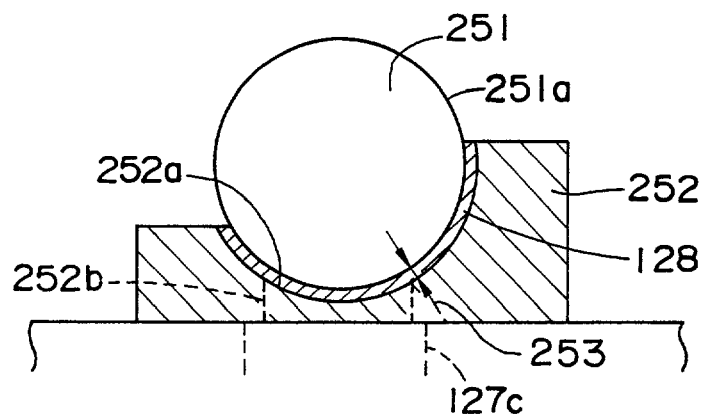
FIG. 5 is a sectional view at a point corresponding to a part I—I shown in FIG. 4, indicating a seal gap in the liquid splash preventing mechanism in FIG. 4.
Figure 6:
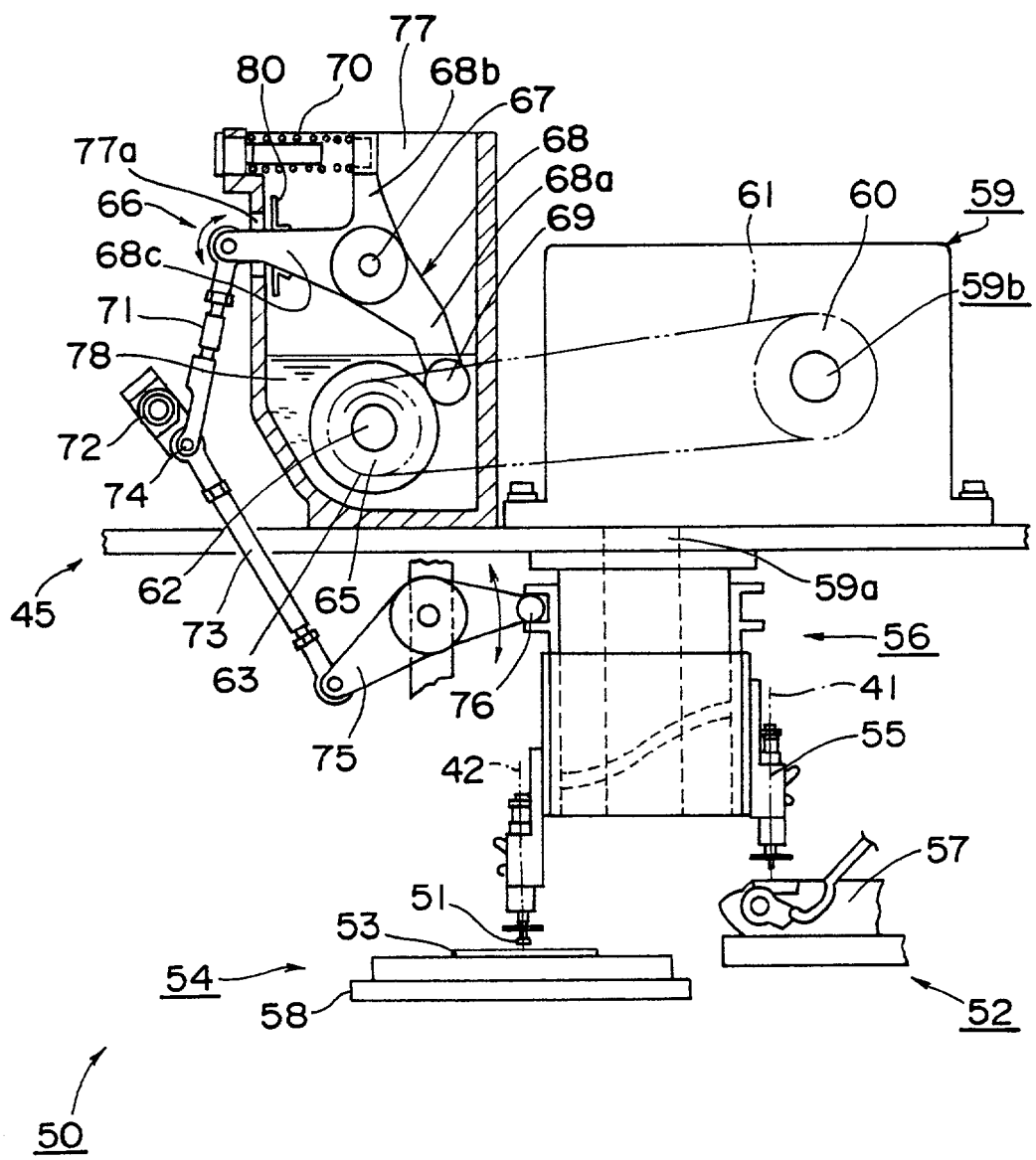
FIG. 6 is a diagram showing a configuration of a conventional component mounting apparatus.

In the above-discussed embodiment, two portions of the first seal member 151 for constituting the liquid splash preventing mechanism 150 are arranged separately in the circumferential direction of the mounting shaft 117 as shown in FIG. 2, and two second seal members 152 are arranged correspondingly to the two portions of the first seal members. This arrangement forms the passage 154 along the axial direction of the mounting shaft 117. A liquid splash preventing mechanism 250 shown in FIGS. 4 and 5 as a modification of the liquid splash preventing mechanism 150 may be used. FIGS. 4 and 5 represent a fundamental structure of the liquid splash preventing mechanism 250.

A first seal member 251 corresponding to the first seal member 151 is a columnar or cylindrical member as illustrated and doubles as mounting shaft 117. A second seal member 252 corresponding to the second seal member 152 is attached to upper wall 127b correspondingly to opening part 127c of the upper wall 127b, and can receive the first seal member 251. The second seal member 252 has a U-shaped, i.e., concave arc face 252a which is shaped to conform to an outer circumferential face 251a of the first seal member 251 and is made concentric or almost concentric with the outer circumferential face 251a. The arc face 252a corresponds to an example functioning as a second outer face. A through hole 252b is formed in the second seal member 252, which is opened to the arc face 252a and through which the first arm 118a of the first driving lever 118 is inserted to pass through the opening part 127c.

In the liquid splash preventing mechanism 250 in FIG. 5, similar to earlier described liquid splash preventing mechanism 150, a sealing gap 253 which corresponds to the sealing gaps 153 is formed between the outer circumferential face 251a of the first seal member 251 and the arc face 252a of the second seal member 252. Unlike the liquid splash preventing mechanism 150, each of the first seal member 251 and the second seal member 252 of the liquid splash preventing mechanism 250 is not separated into two portions. The sealing gap 253 between the outer circumferential face 251a and the arc face 252a is formed in an axial direction and in a circumferential direction of the first seal member 251, in other words, to a periphery of the through hole 252b as is apparent from FIG. 4. The lubricating oil 128 is preferably filled in the sealing gap 253. Since passage 154 is not formed in the liquid splash preventing mechanism 250, even splash of the lubricating oil 128 can be prevented from being discharged to the outside of the lubricating oil tank 127 even if the chamber 155 is not formed.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component mounting apparatus comprising:

a lift mechanism, including an oil splash preventing mechanism, for moving a component holding member up and down when a component is to be held and mounted by the component holding member, wherein said oil splash preventing mechanism is arranged at an opening part formed at an upper wall of an oil storage tank and has a first seal member and a second seal member attached correspondingly to the opening part so as to prevent oil filled in the oil storage tank from scattering to an exterior of the oil storage tank through the opening part, with said first seal member being arranged opposite to said second seal member via a sealing gap, formed between a first outer face of said first seal member and a second outer face of said second seal member, for preventing scattering of the oil to the exterior of the oil storage tank through the opening part by virtue of being filled with the oil, wherein said second outer face is shaped in conformity with said first outer face, with said first outer face and said second outer face facing one another.

2. The component mounting apparatus according to claim 1, wherein said first seal member comprises a cylindrical member and said first outer face comprises an outer circumferential face of said cylindrical member, and said second outer face comprises a U-shaped arc face conforming to said outer circumferential face.

3. The component mounting apparatus according to claim 1, further comprising:
 a holding member rotating/moving device that is to move so as to rotate the component holding member along a circumference.

4. A component mounting apparatus comprising:
 a holding member rotating/moving device that is to move so as to rotate a component holding member along a circumference; and
 a lift mechanism for moving the component holding member up and down when a component is to be held and mounted by the component holding member,
 wherein said lift mechanism has a driving part for generating a driving force for moving the component holding member up and down, and also has an oil splash preventing mechanism,
  with said driving part including
   (i) a cam which is to be stored in a state soaking in lubricating oil inside a lubricating oil tank having an opening part formed at an upper wall thereof,
   (ii) a roller in contact with said cam, and
   (iii) a first driving lever having one end attached to said roller, and having another end extending to an exterior of the lubricating oil tank through the opening part, and
  with said oil splash preventing mechanism being arranged at the opening part and having a first seal member and a second seal member fitted to the upper wall of the lubricating oil tank,
   said first seal member comprising a cylindrical member which supports said first driving lever and is arranged opposite to said second seal member via a sealing gap, formed between an outer circumferential face of said cylindrical member and said second seal member, for preventing scattering of the lubricating oil by virtue of being filled with the lubricating oil, and
   said second seal member having a U-shaped arc face conforming to said outer circumferential face.

5. The component mounting apparatus according to claim 4, wherein
 said rotating/moving device further comprises a mounting head part for attaching the component holding member thereto,
  with said cam to be driven by said rotating/moving device, and said driving part to generate a driving force for moving the component holding member up and down by having said first driving lever driven in response to said cam being driven, and
  with said lift mechanism further having a link mechanism part for moving the component holding member up and down via the driving force generated by said driving part,
 wherein said link mechanism part has a coupling link part coupled to said first driving lever, and also has a second driving lever having one end coupled to said coupling link part and having another end engaged with said mounting head part.

6. An oil splash preventing mechanism installed at an opening part formed at an upper wall of an oil storage tank, comprising:
 a first seal member and a second seal member, arranged correspondingly at the opening part for preventing oil stored in the oil storage tank from scattering to an exterior of the oil storage tank through the opening part,
 wherein said first seal member is arranged opposite to said second seal member via a sealing gap, formed between a first outer face of said first seal member and a second outer face of said second seal member, for preventing scattering of the oil to the exterior of the oil storage tank through the opening part by virtue of being filled with the oil, with said second outer face being shaped in conformity with said first outer face, and with first outer face and said second outer face facing one another.

7. The oil splash preventing mechanism according to claim 6, wherein
 said first seal member comprises a cylindrical member and said first outer face comprises an outer circumferential face of said cylindrical member, and
 said second outer face comprises a U-shaped arc face conforming to said outer circumferential face.

* * * * *